United States Patent
Ramanathan et al.

(10) Patent No.: US 6,952,790 B2
(45) Date of Patent: Oct. 4, 2005

(54) SYSTEM FOR VARYING TIMING BETWEEN SOURCE AND DATA SIGNALS IN A SOURCE SYNCHRONOUS INTERFACE

(75) Inventors: Girish P. Ramanathan, Ranco Cordova, CA (US); Srinivasan T. Rajappa, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 607 days.

(21) Appl. No.: 09/820,898

(22) Filed: Mar. 30, 2001

(65) Prior Publication Data

US 2002/0144195 A1 Oct. 3, 2002

(51) Int. Cl.[7] .................................................. G06F 1/04
(52) U.S. Cl. ...................................... 713/401; 713/503
(58) Field of Search ................................. 713/400, 401, 713/500, 501, 503, 600; 324/535, 763, 765; 714/48, 55, 703, 712, 718, 727, 731

(56) References Cited

U.S. PATENT DOCUMENTS

| | | | | |
|---|---|---|---|---|
| 5,291,141 A | * | 3/1994 | Farwell et al. ............... 324/617 |
| 6,286,118 B1 | * | 9/2001 | Churchill et al. ............ 714/726 |
| 6,401,213 B1 | * | 6/2002 | Jeddeloh ...................... 713/401 |
| 6,467,043 B1 | * | 10/2002 | LaBerge ...................... 713/401 |
| 6,477,659 B1 | * | 11/2002 | Ho .............................. 713/503 |
| 6,535,986 B1 | * | 3/2003 | Rosno et al. ................ 713/400 |
| 6,665,808 B1 | * | 12/2003 | Schinzel ...................... 713/501 |

* cited by examiner

Primary Examiner—Thuan Du
(74) Attorney, Agent, or Firm—Schwegman, Lundberg, Woessner & Kluth, P.A.

(57) ABSTRACT

A system for measuring timing margins in an interface between a core and an input/output device on a chipset. In order to measure the amount of available variation in data and strobe signals, delay lines are introduced so that the data and strobe signals may be varied in relation to each other. By incrementally changing the delay and hence the time difference between the two signals, it is possible to determine the allowable variation when the device fails to operate. By providing delays on both sides, it is possible to determine the timing margin on both the setup and hold of the signals.

7 Claims, 13 Drawing Sheets

SYSTEM FOR VARYING TIMING BETWEEN SOURCE AND DATA SIGNALS IN A SOURCE SYNCHRONOUS INTERFACE

FIELD

The present invention is a system for measuring the timing margin in relation to data and strobe signals in an interface. More particularly, the present invention is related to a system for delaying data and strobe signals so as to vary the setup and hold and thus determine the interface timing margin.

BACKGROUND

Most electronic equipment, and in particular computers, utilize a series of chips which are connected to a motherboard in order to form the signal processing part of the equipment. Various chips may assume a single function or multiple functions which are used by the equipment. The group of chips used together is sometimes referred to as a chipset.

FIG. 1 is a block diagram showing the arrangement of a chipset on a motherboard for a computer. The chip set 100 includes a first chip 102 which carries the central processing unit for the device. Memory controller hub 104 acts as a central controller to move data into and out of memory and to other related chips. Chip 106 is a graphics chip which generates various graphic arrangements for display. Chip 108 is the memory itself, either RAM or ROM memory. Chip 110 is an input/output controller hub which transfers data to various input/output devices. Chip 112 includes connections to a hard disk drive. Chip 114 is a chip which connects to other peripheral components.

Typically, each chip in a chip set is formed of two parts. The first part is the core which is the circuitry which handles the main function of the device itself. Also on the chip are input/output circuits for connecting the core to other chips. For example, the memory controller 104 would have a central core and an input/output device connected to each of the four other chips 102, 106, 108 and 110 to which it is connected.

For every pair of chips that are connected, an interface is provided to connect the input/output devices of the chips to each other. Thus, the CPU 102 and memory controller hub 104 are connected by a front side bus (FSB) 116. Likewise, memory controller hub 104 is connected to graphics chip 106 through the advanced graphics port (AGP) 118. Memory 108 is connected to the memory controller hub 104 by a system memory bus 120. Memory controller hub 104 is connected to the input/output controller hub 110 through hub link 122. The input/output controller hub 110 is connected to the hard disk drive 112 through IDE 124. The I/O controller hub 110 is connected to the peripheral components chip 114 through the peripheral components interface 126.

FIG. 1 also shows a clock circuit 113 which is another chip connected on the motherboard. This clock provides clock signals of various frequencies to the various other chips. These particular connections are not specifically shown but all chips on the motherboard are connected thereto to receive clock signals which are necessary for the synchronization of the entire device.

Some of the interfaces on the motherboard are considered to be source synchronous interfaces. In the present example, the front side bus 116, the advanced graphics port 118 and the hub link 122 are all source synchronous circuits. On the other hand, a system memory bus 120 and IDE 124 are not source synchronous interfaces. In such an interface, data signals and strobe signals are used to transfer data in a synchronous fashion. These signals occur in a certain preset timing relationship so that data being transferred can be expected at a particular time location.

BRIEF DESCRIPTION OF THE DRAWING(S)

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and the invention is not limited thereto. The spirit and scope of the present invention are limited only by the terms of the appended claims.

The following represents brief descriptions of the drawings, wherein.

DETAILED DESCRIPTION

Figure 1:
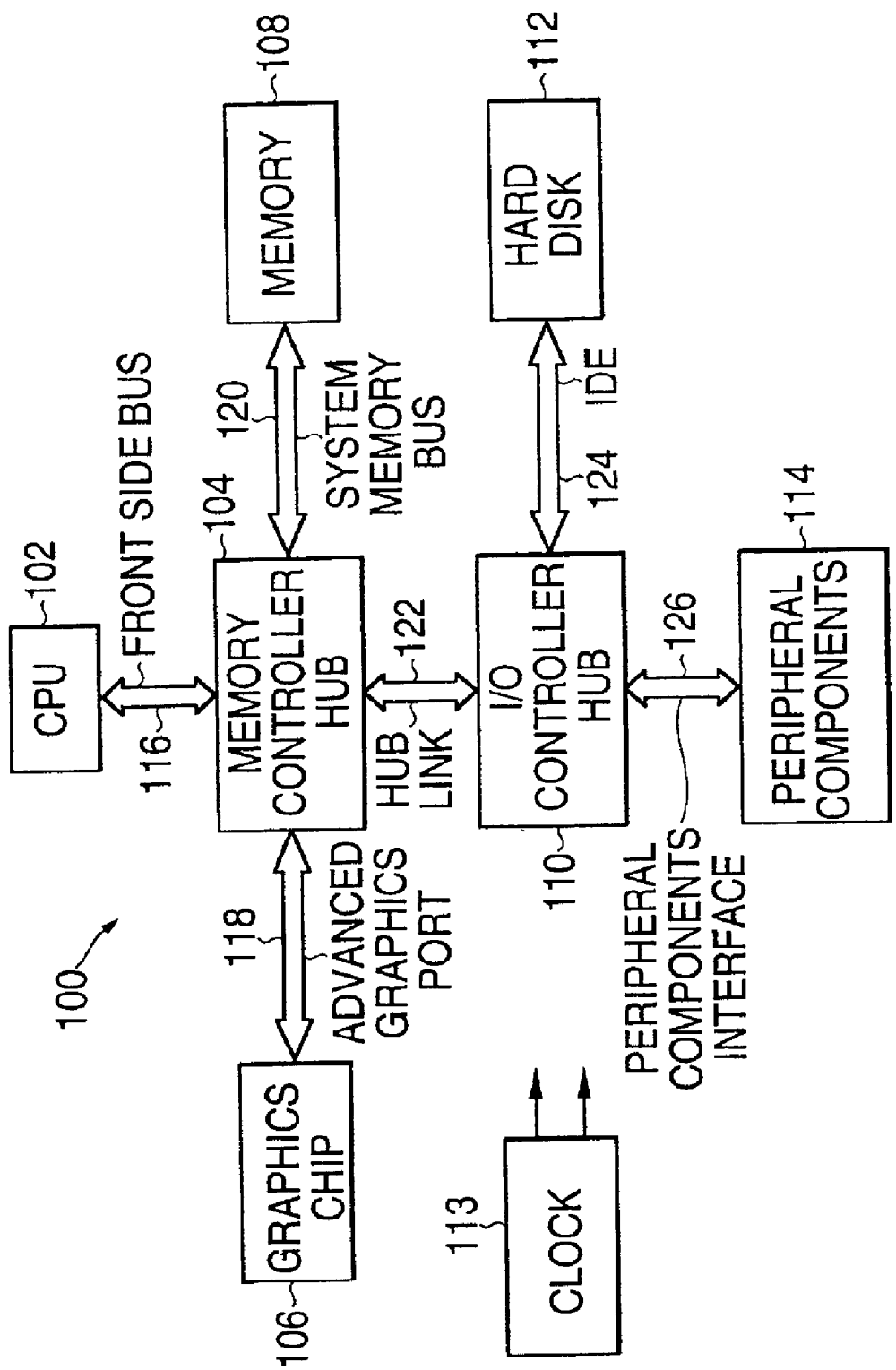
FIG. 1 is an example block diagram of an example chipset system.

Before beginning a detailed description of the subject invention, mention of the following is in order. When appropriate, like reference numerals and characters may be used to designate identical, corresponding or similar components in differing figure drawings. Further, in the detailed description to follow, example sizes/models/values/ranges may be given, although the present invention is not limited to the same. Still further, the clock and timing signal FIGS. are not drawn to scale, and instead, exemplary and critical time values are mentioned when appropriate. With regard to description of any timing signals, the terms assertion and negation may be used in an intended generic sense. More particularly, such terms are used to avoid confusion when working with a mixture of "active-low" and "active-high" signals, and to represent the fact that the invention is not limited to the illustrated/described signals, but could be implemented with a total/partial reversal of any of the "active-low" and "active-high" signals by a simple change in logic. More specifically, the terms "assert" or "assertion" indicate that a signal is active independent of whether that level is represented by a high or low voltage, while the terms "negate" or "negation" indicate that a signal is inactive. As a final note, well known power/ground connections to ICs and other components may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements is highly dependent upon the platform within which the present invention is to be implemented, i.e., specifics should be well within purview of one skilled in the art. Where specific details (e.g., circuits, flowcharts) are set forth in order to describe example embodiments of the invention, it should be apparent to one skilled in the art that the invention can be practiced without these specific details. Finally, it should be apparent that any combination of hard-wired circuitry and software instructions can be used to implement embodiments of the present invention, i.e., the present invention is not limited to any specific combination of hardware circuitry and software instructions.

Although example embodiments of the present invention will be described using an example system block diagram in an example personal computer (PC) environment, practice of the invention is not limited thereto, i.e., the invention may be able to be practiced with other types of systems, and in other types of environments (e.g., servers).

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

In designing and testing chipsets, the designed time relationship between the data and strobe signals may not always be exactly achieved. Thus, due to uncontrollable parameters and finite distances that must be traversed, the timing may actually not be exactly as designed. Accordingly, when testing the chipset it is desirable to obtain a direct measurement of the actual timing relationship between the two signals in order to understand how close to the specification the relationship between the signals is. Making direct measurements by inserting probes is a possibility but it is quite difficult when operating on this scale. Also, merely inserting test signals and determining that the device operates is not sufficient because it is impossible to tell how much additional error can be tolerated before the device becomes inoperative. Thus, it is desirable to determine the actual relationship between the two signals so as to determine the timing margin, or extra margin for error in the timing of the two signals. The relationship between the two signals at the front edge of their pulses is referred to as the setup while the relationship at the tail edge of the pulse is referred to as the hold of the data signal with respect to the strobe signal.

It would therefore be useful to vary the setup and hold of the signals in order to determine how much error is present and accordingly how much additional error can be tolerated. While some thought has been given in the past to the possibility of delaying the strobe signal to detect the amount or error in the hold, or tail edge of the two signals, this has always been considered in regard to a timing signal which is used for generating the strobe signal. However, this has not been completely suitable. Further, it is not possible to delay the data signal to detect for errors in the setup.

The following description describes the basic operation of transmitting data from one chip to another. As indicated above, the clock 113 provides a common clock signal to various chips. The chips may contain a phase locked loop to maintain the integrity of this signal. If one chip has already requested data from another chip, for example, the graphics chip 106 requesting data from the memory controller hub 104, the data will be prepared and placed in a condition to transmit. The data however will not be moved until the requesting chip sends a request signal. When this is transmitted, it is received at the requested chip and converted to a transmit signal. The transmit signal is processed and the data and strobe signals are then produced by the requested chip for transmission to the requesting chip.

Since both the chips utilize the same clock, it is possible to establish the timing involved. The requesting chip sends the request signal in conjunction with the clock signal at 66 MHz so that the request signal has a length of one cycle of the clock signal and begins at the rising edge of a clock signal. This signal takes a certain amount of time to reach the requested chip, known as the flight time, which is less than one cycle. The transmit signal is then generated in the requested chip and also is one clock cycle in length and arranged to begin at the beginning edge of the next clock cycle. This signal is processed and causes the generation of the data and strobe signals at the beginning of the following clock cycle. The data and the strobe signals also last for one clock cycle in length.

Figure 2:
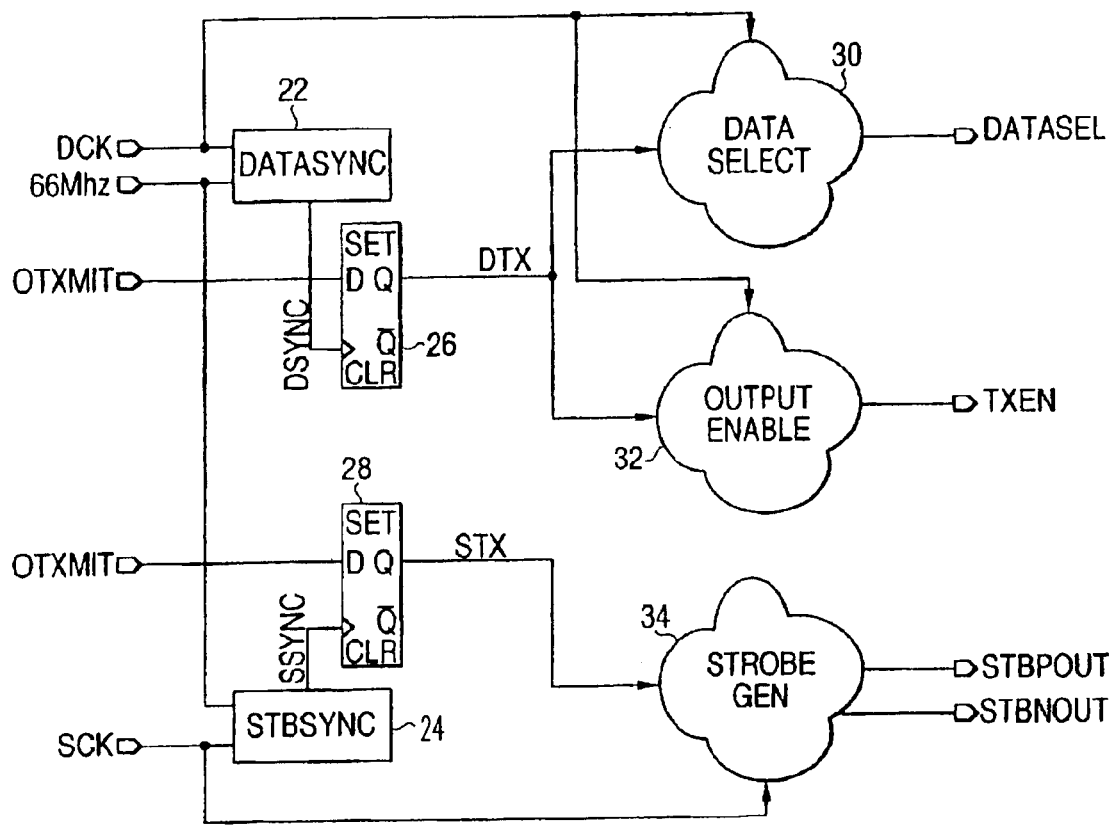
FIG. 2 is an example block diagram of an example interface.

An interface 20 is seen in part in FIG. 2. The interface receives a number of inputs from a core. In particular, signals DCK and SCK which occur at a frequency of 533 MHz are received which have been generated from clock 113. These two signals have the same frequency, but in most operations are 180° out of phase. During some modes, the two signals will be in phase, but not in the discussion presented below. In addition to the two signals being out of phase, specifications call for them to be offset in time by roughly 1.875 nanoseconds, which is one cycle of 533 MHz. In reality, this time difference may vary due to the particular layout of the circuitry on the chipset and due to other uncontrollable parameters. The measurement of this time relationship is the heart of the present invention. Another clock signal at 66 MHz, or a frequency 1/8 that of the other two signals, is also generated by the clock.

The DATASYNC element 22 receives the DCK and 66 MHz signals. This element sends out a signal DSYNC due to a certain timing relationship between these two clock signals. In particular, the DSYNC signal is started at the end of the $6^{th}$ pulse of the DCK signal measured from the beginning of the 66 MHz signal. In other words, during the cycle of the 66 MHz signal, there occurs eight cycles of the DCK signal with the DSYNC signal being generated at the tail end of the $6^{th}$ cycle out of the 8. Thus, the DSYNC signal occurs with the start of the $7^{th}$ out of 8 cycles.

In a similar fashion, STBSYNC element 24 also receives the SCK signal as well as the 66 MHz signal. This element works in a similar fashion to the DATASYNC element 22 to produce signal SSYNC except that it occurs one cycle of the 533 MHz signal later than the DSYNC signal. Thus this signal occurs 1.875 nanoseconds later. The DSYNC and SSYNC signals are then applied as clock inputs to the flipflops 26 and 28, respectively.

The data inputs of these flipflops are connected to an additional signal coming from the core, namely OTXMIT. This is a transmit signal which is generated by a common clock flipflop inside the core. This pulse occurs at the tail edge of the $6^{th}$ cycle of the 533 MHz signal. The flipflops generate signals DTX and STX respectively. This signal starts when the signal is received at the set input and stops when a reset signal is received without having a set input. These two signals are then used as inputs to three state machines 30, 32 and 34 indicated as data select, output enable and strobe generator. The DTX signal is forwarded to the first two along with the DCK signal. The third receives the STX and SCK signals. The DTX and STX signals are used to initiate the state machines which then generate output signals.

Figure 3:
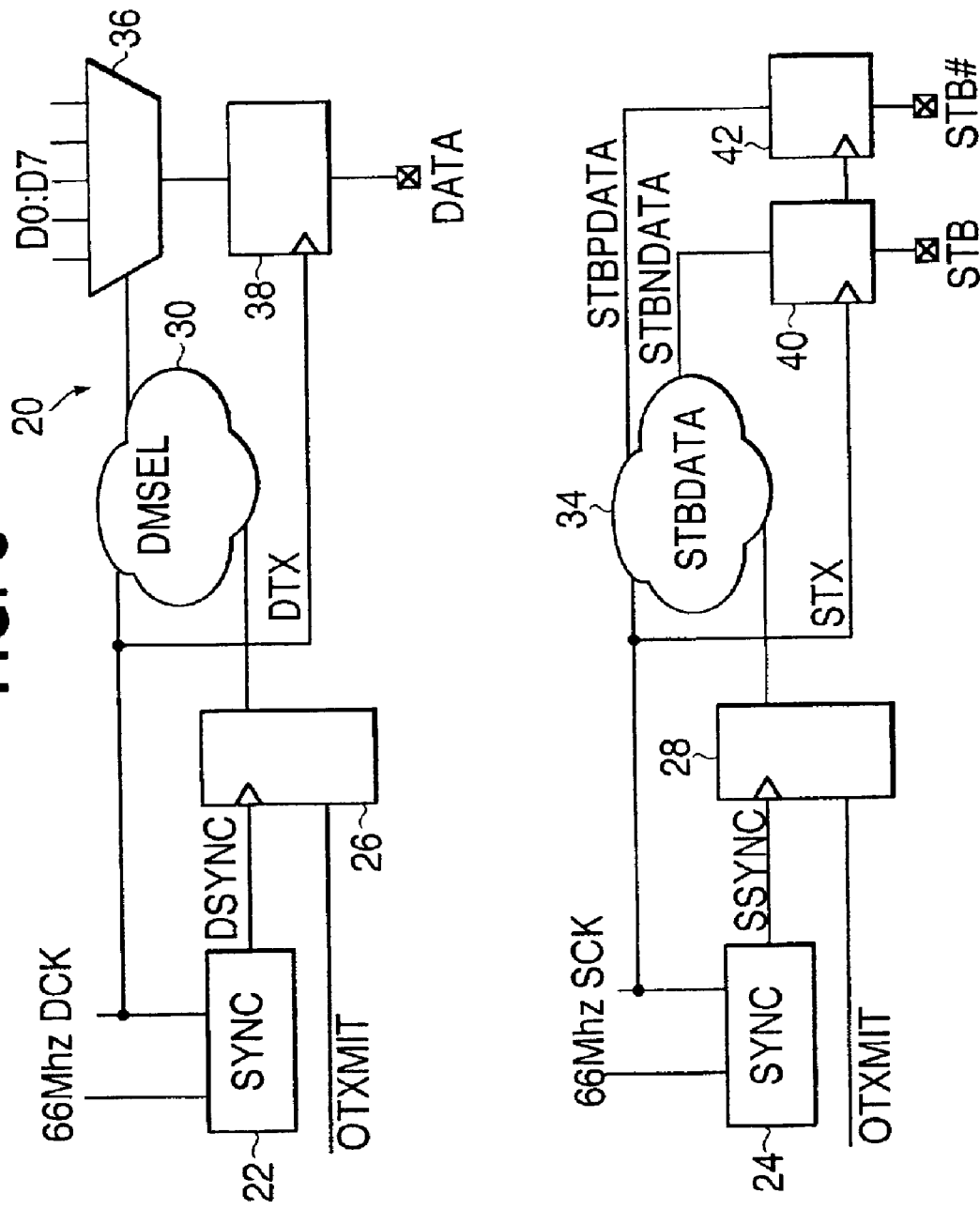
FIG. 3 is another example block diagram of an example interface.

FIG. 3 shows interface 20 in another form without the output enable state machine 32 but including other elements which occur after the state machines. A multiplexer 36 receives the data select signal from the data select machine 30 to cause data inputs D0–D7 to be multiplexed. These data signals are then serialized and sent to flipflop 38 which is also connected to the DCK signal so as to cause the data signals to be clocked through to form the DATA output signal. Similarly, the output of the strobe generator 34 produces two complementary strobe signals which are clocked through a pair of flipflops 40 and 42 BYSCK to produce complementary output signals STB and STB#.

The above indicates the general operation of the interface circuit and describes the timing relationship between the data and strobe signal. Due to the layout of the connecting lines on the chipset and due to other interfering parameters, the timing relationship between the data and strobe signals will not always hold at the specified interval of 1.875 nanoseconds. In order to determine how much variation can be absorbed by the system and still operate, it is desirable to deliberately vary the relationship between the data and strobe signals to determine how much change will be accepted and still have the device operational. Delays may be inserted in the system, as described below to vary this relationship. It is then possible to change the relationship between the signals gradually to determine at what point the system fails. This then gives the designers some feedback as to how flexible the current arrangement is. By including these delays as part of the fixed device on the chipset, it is relatively easy to cause the delay and to measure the result without using probes and outside measuring equipment.

Figure 4:
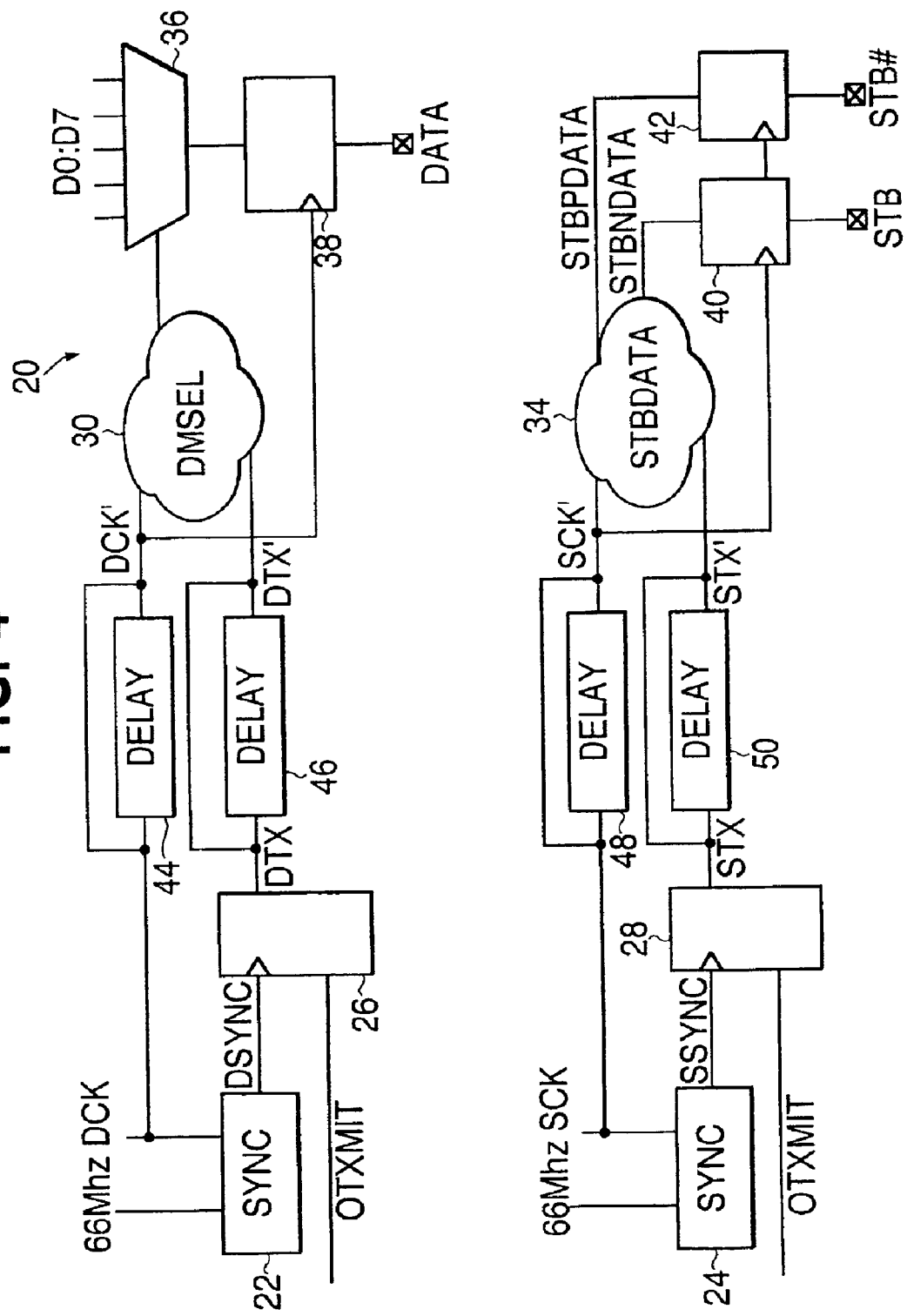
FIG. 4 is an example block diagram of an example interface in an advantageous arrangement of the present invention.

FIG. 4 shows another embodiment similar to FIG. 3 but with a series of delay lines incorporated so as to allow the various signals to be delayed and thus the timing relationships between the data signals and strobe signals may be varied in order to measure the time margins. The delays may be controlled from outside or varied according to a preset scheme automatically from inside the processor. These control connections are not shown in the figures. By providing delay lines on both the data and strobe parts of the interface, it is possible to vary the relationship between the two basic signals. The data side of the interface contains two delay lines 44 and 46 which respectively delay signals DCK and DTX. It is necessary to delay both of these signals by the same amount in order to maintain their relationship to each other. Likewise, both delays 48 and 50 provide the same delay to signals SCK and STX so that their relationship is maintained. However, the delay between lines 44 and 46 on the one hand and lines 48 and 50 on the other hand will be varied to change the setup and hold of the data with respect to the strobe and to determine the time margins.

Figure 5:
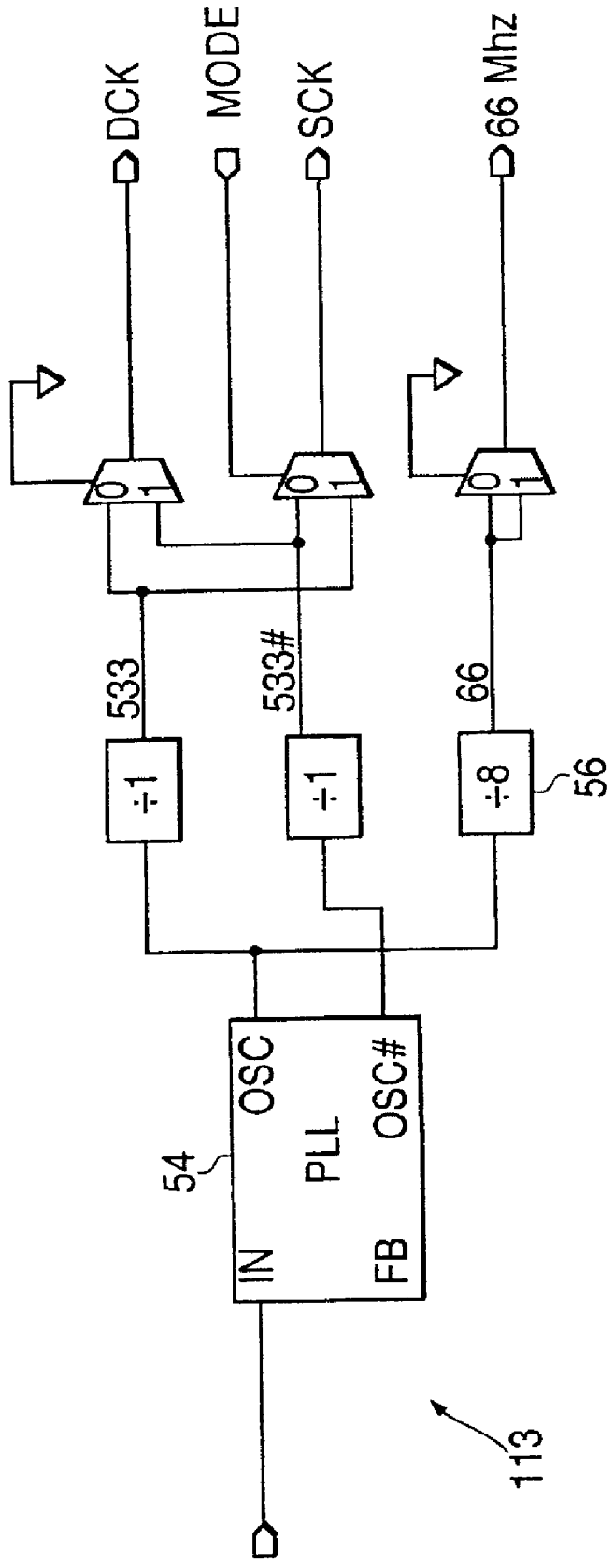
FIG. 5 is an example block diagram of an example clock circuit for the present invention.

FIG. 5 shows clock circuit 113 which is a part of the core. In includes a phase locked loop 54 which generates a first signal of 533 MHz and an inverse of the same signal. The first of these signals is also fed to a divide by eight circuit 56 so as to produce a 66 MHz clock signal. The first signal is processed to form the DCK signal. Depending on the mode in which the device is placed, the SCK signal is generated which is 180° out of phase with the DCK signal as indicated above. In other modes, the SCK and DCK signals are identical. The third signal is used as a 66 MHz signal as described in FIG. 2.

Figure 6:
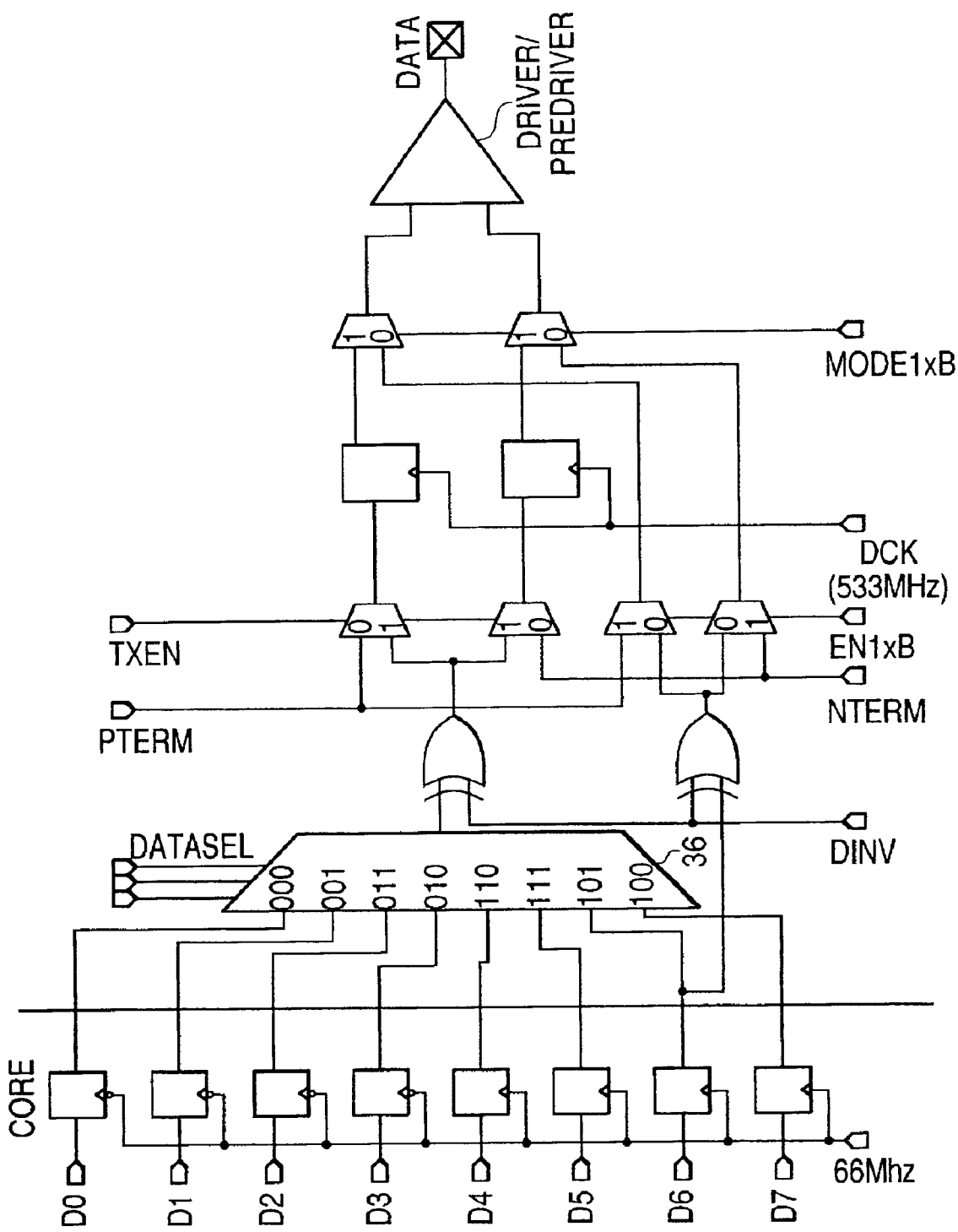
FIG. 6 is an example block diagram of part of the example system shown in FIG. 4.

FIG. 6 shows in greater detail the use of the multiplexer 36 in the generation of data signals from this part of the interface. The individual data signals D0–D7 are provided from the core and selected in multiplexer 36 by the data select signal from state machine 30. Other data signals are also utilized such as the DCK signal to provide the output signals at the proper timing. The output enable signal from state machine 32 is also used to synchronize the signal with these strobe signals.

Figure 7:
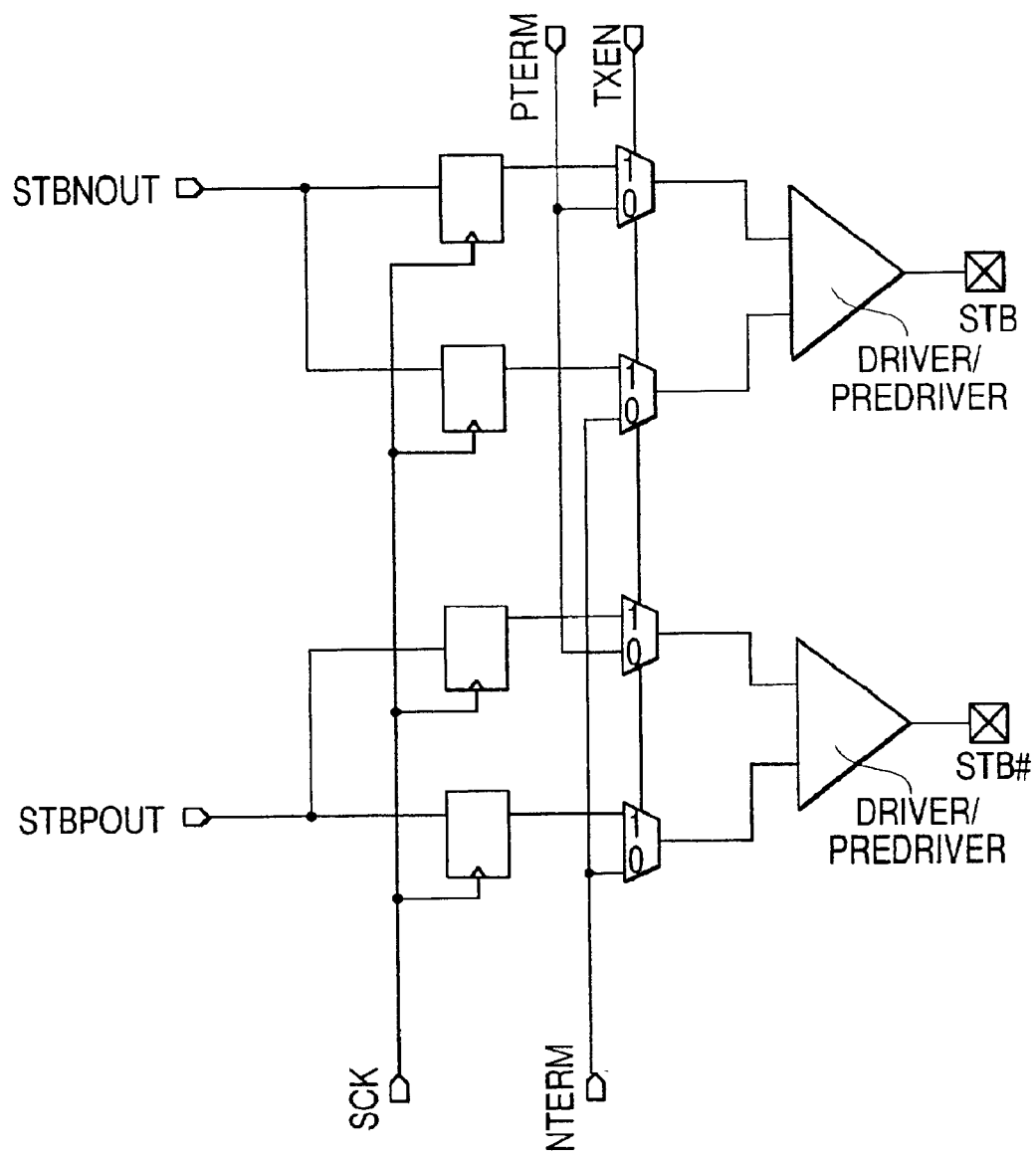
FIG. 7 is an example block diagram of part of the example system shown in FIG. 4.

Similarly, FIG. 7 shows the formation of the strobe signal and the gating of these signals using the output enable signal and others to properly time the signal.

Figure 8:
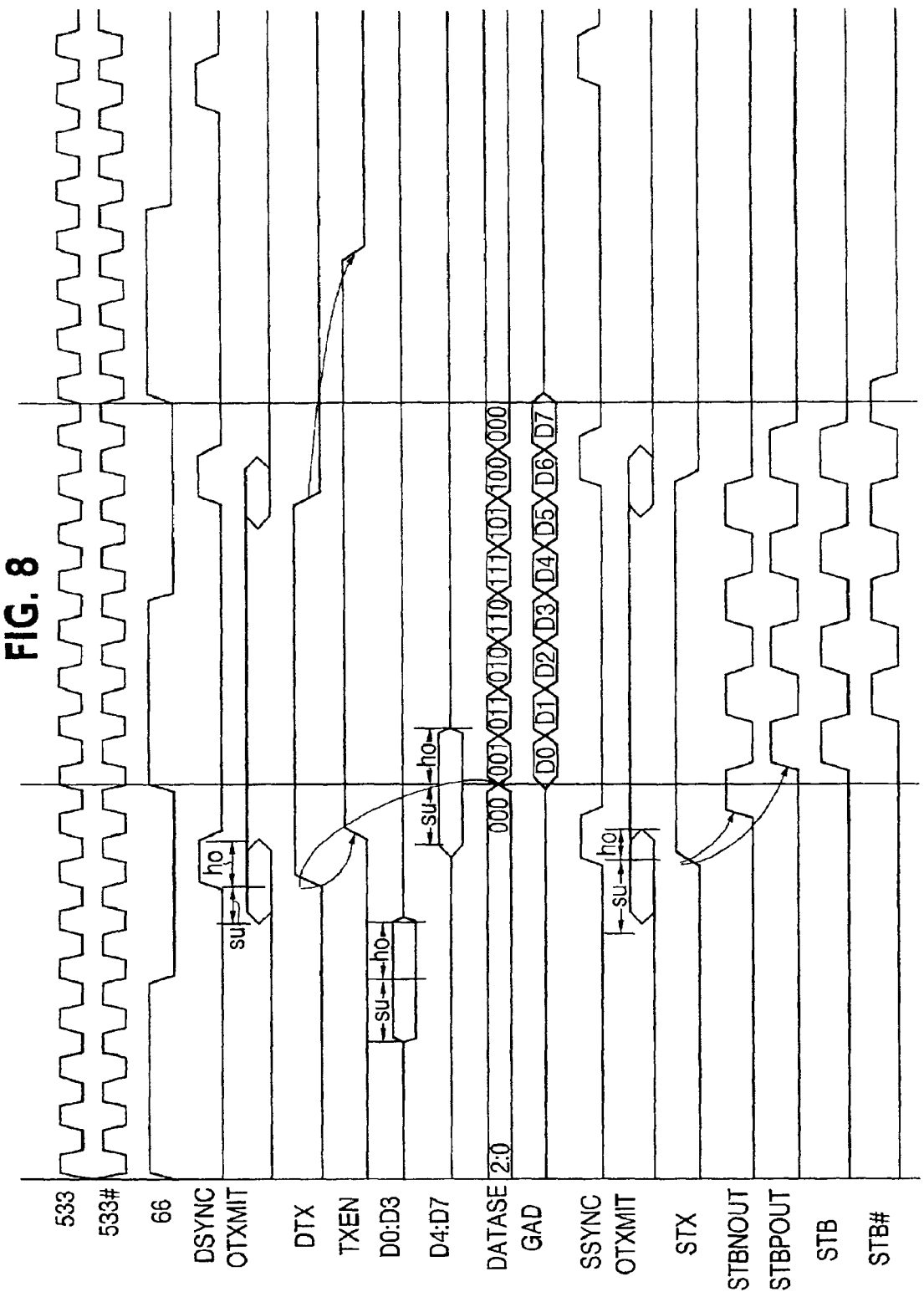
FIG. 8 is an example timing diagram of an example system having an advantageous arrangement of the present invention.

FIG. 8 is a timing diagram showing the timing relationship between the various signals described above. Some of the signals have indicated thereon two sections, indicated by "su" and "ho". This is to designate the setup or beginning portion of the signal and the hold or trailing portion of the signal. Some arrows are also presented to show a causal relationship between signals, that is where one signal causes the production of another signal.

Figure 9:
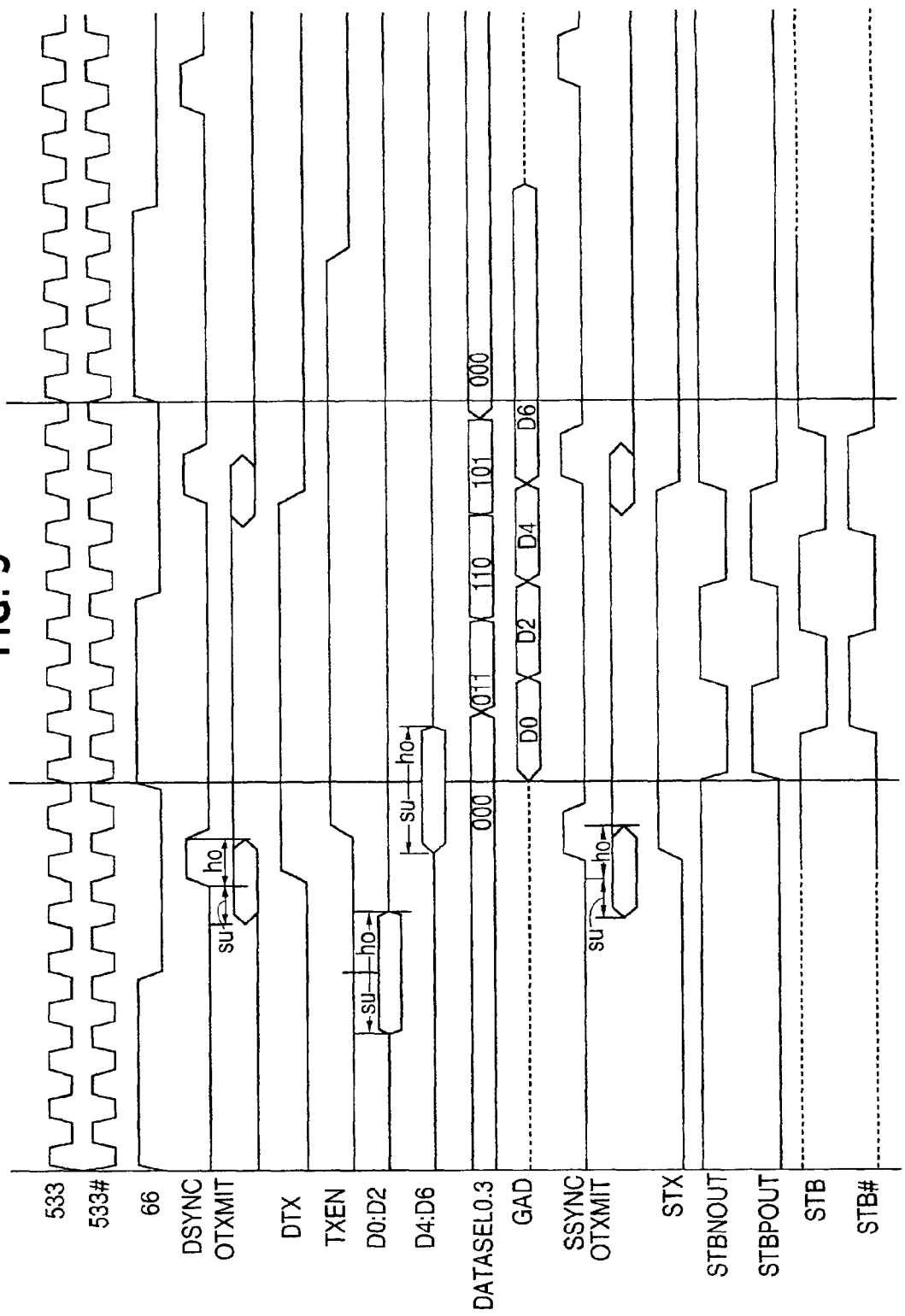
FIG. 9 is an example timing diagram of an example system having an advantageous arrangement of the present invention.
Figure 10:
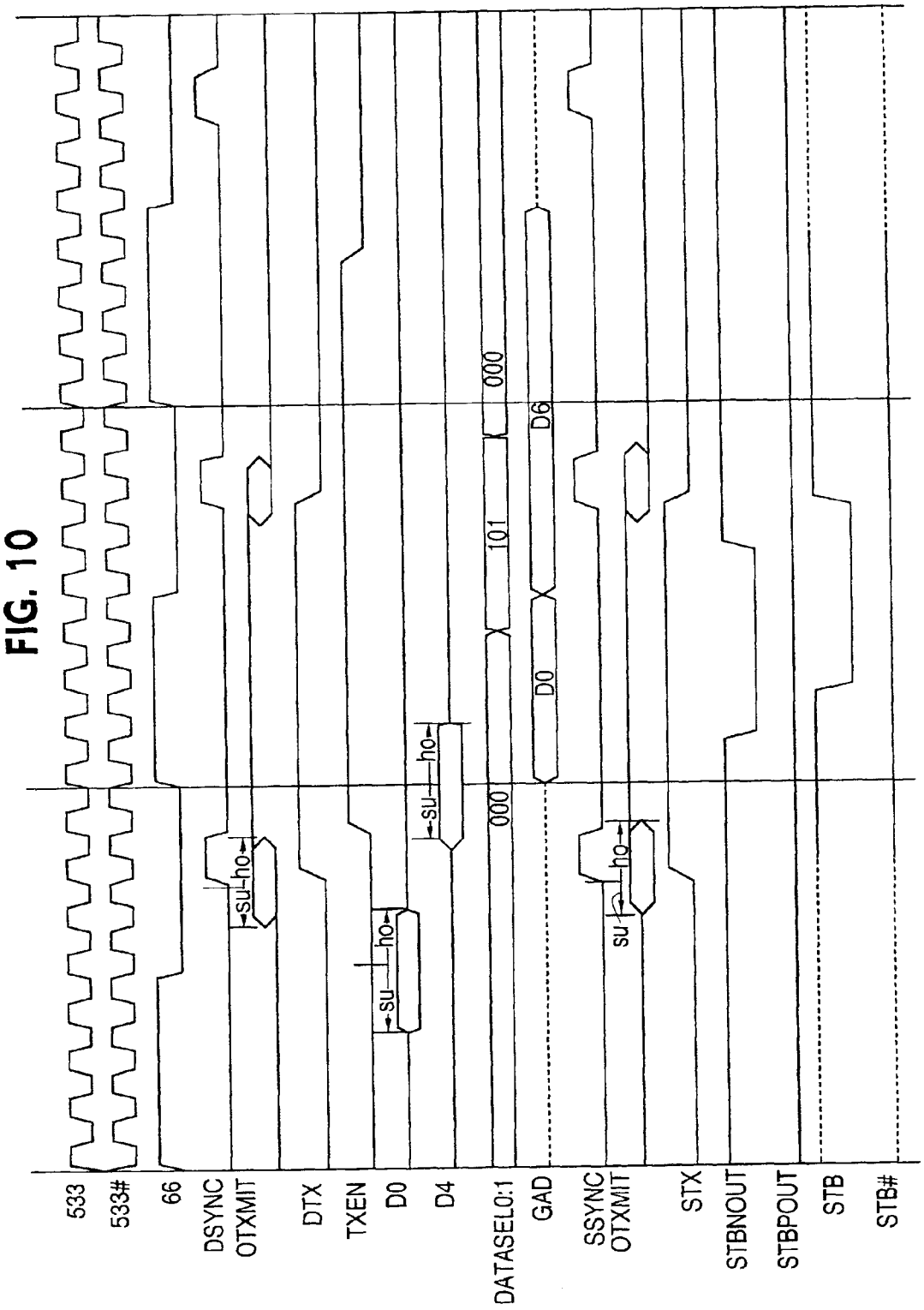
FIG. 10 is an example timing diagram of an example system having an advantageous arrangement of the present invention.

FIGS. 9 and 10 show similar timing diagrams. However, in each of these cases the multiplexer only is used for four or two data signals rather than eight. Thus, the number of data signals is smaller with each signal being larger in time and likewise there are fewer strobe signals with each one being larger in time.

Figure 11:
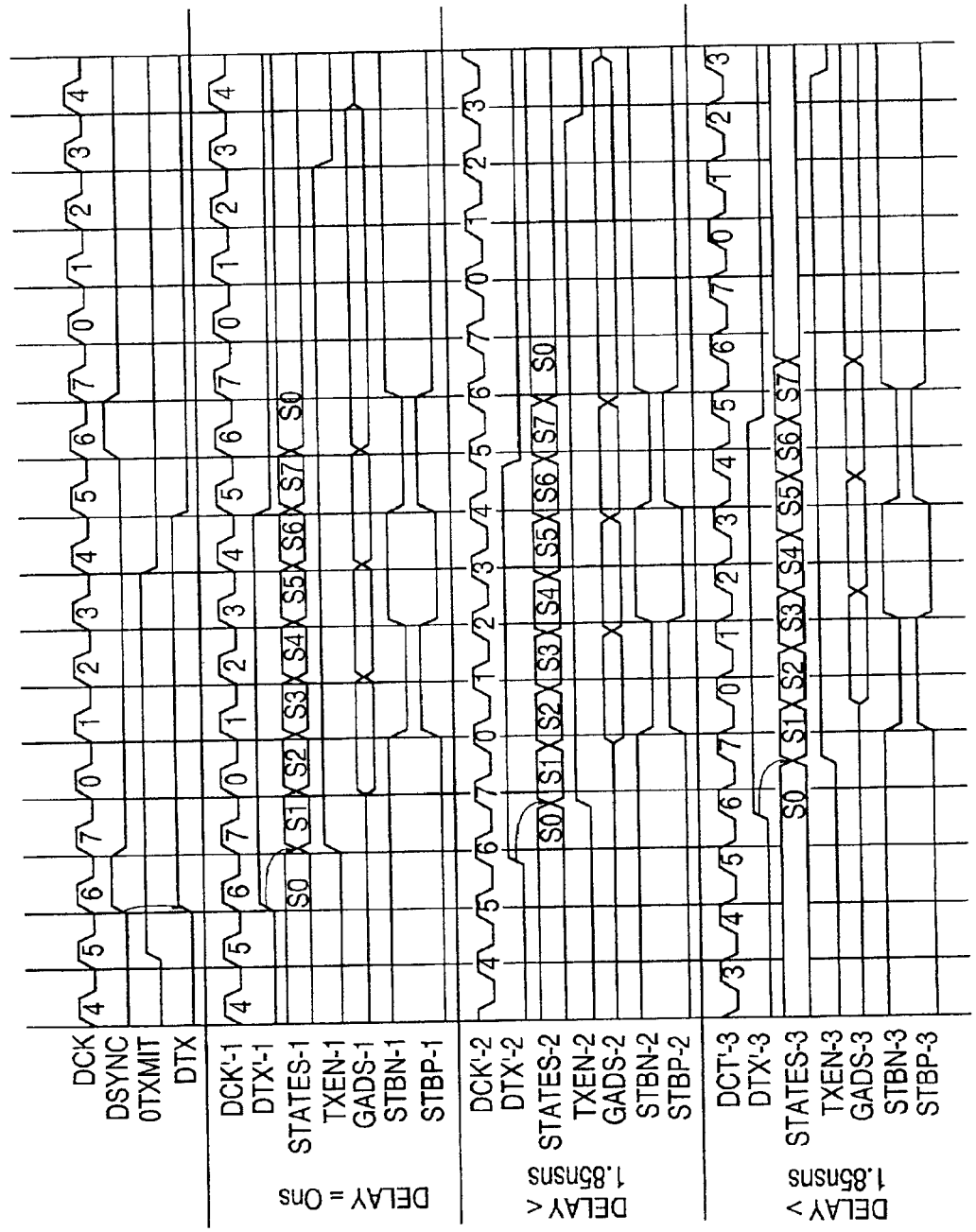
FIG. 11 is an example comparative timing system of an example system having an advantageous arrangement of the present invention.
Figure 12:
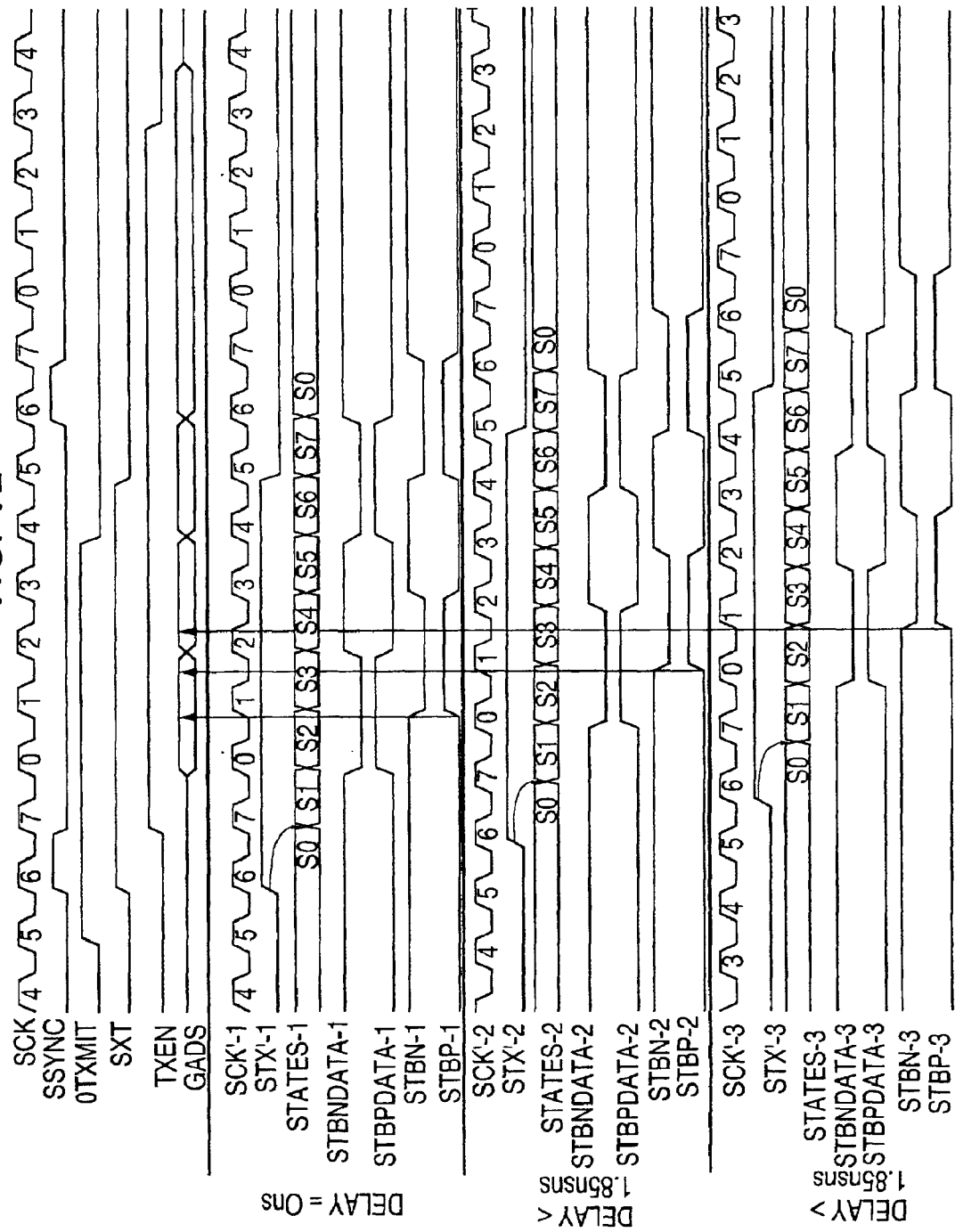
FIG. 12 is an example comparative timing system of an example system having an advantageous arrangement of the present invention.

FIGS. 11 and 12 include comparative timing charts similar to those shown in FIG. 8–10. However, the top section in each signal includes signals which are not changed by a delay, the second section includes a series of signals which would be affected by a delay but where no delay is present. The third and fourth sections include the same signals as the second section but where the delay is greater than 0 and less than 1.875 nanoseconds, or greater than 1.875 nanoseconds, respectively. In FIG. 11, it is the data signal which is being delayed while in FIG. 12 it is the strobe signal which is being delayed. In FIG. 11, when no delay is present the signal indicated as GADS-1 begins one interval (indicated by the vertical line and equivalent to 1.875 nanoseconds) before the change in level of the two lines below it indicated as STBN-1 and STBP-1. In the following section where the delay is less than 1.875 nanoseconds, the corresponding line indicated as GADS-2 is delayed by some amount between the two vertical lines while the strobe signal indicated in the following two sections remains the same. In the third section, the GADS-3 signal has passed beyond the beginning of the strobe change position. When the GADS signal goes beyond this point the data and strobe signals will be out of sync and errors will occur. When the delay is less than 1.875 nanoseconds, if no additional delay occurs due to the wiring arrangement, the device will work properly. However, since some uncontrolled parameters will normally occur to some degree, it is only by varying the delay in increments that it is possible to determine exactly how much delay can be tolerated.

In FIG. 12, the corresponding arrangement occurs for the delayed strobe signal. Thus the line which is indicated by states-1 will move to the right in comparison to the GADS signal shown in the top portion.

Thus, in order to measure the timing margin, the device is first operated with no delay in either direction. Using the same instructions, a series of operations follow with the delay on the data side being increased gradually until the device no longer operates properly. The delay on the data side is reset to zero and the delay on the strobe side then is incrementally varied in a similar fashion until failure is found again. In doing this, the operator can determine the timing margin in both directions and thus the ability of the device to handle a variation in the two signal streams.

Figure 13:
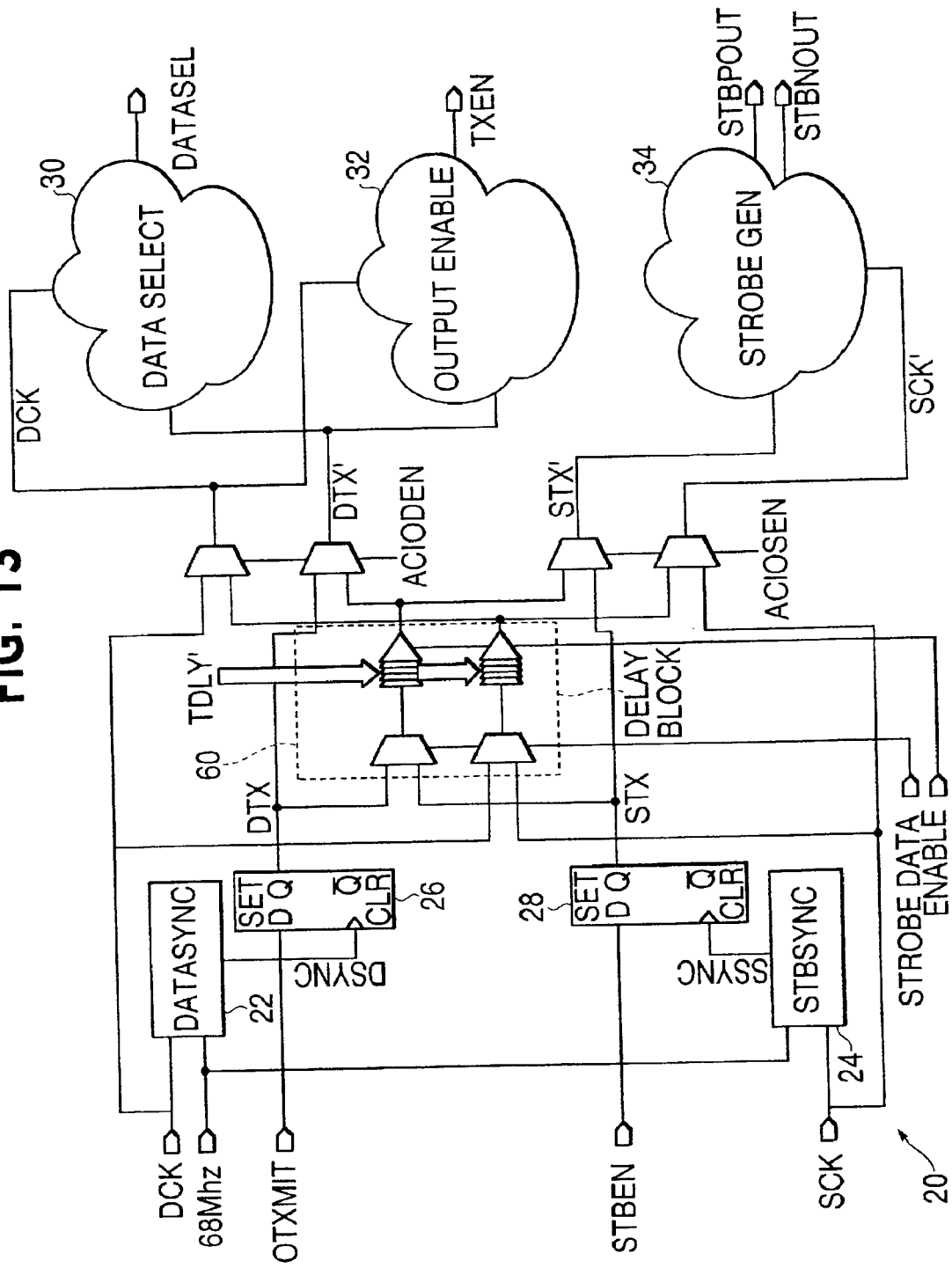
FIG. 13 is an example block diagram of an example system having an advantageous arrangement of the present invention.

FIG. 13 shows another embodiment of the interface 20 in a fashion similar to that shown in FIG. 2. However, in this embodiment the delay line 60 is shown as being shared by both the data side and the strobe side. The delay 60 includes two delay lines, one of which is connected to both STX and DTX and the other of which is connected to both SCK and DCK. An input device in each line permits only one of the two inputs to be selected. Thus rather than having two complete sets of delay lines as shown in FIG. 4, one set can be shared by both sides since they are not used at the same time.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A method of determining time margins between strobe and data signals in an interface, comprising:

connecting an interface between two chips, at least one having a core and an input/output device;

providing data and strobe signals from said core to said interface;

providing a delay in one of said data and strobe signals within said interface;

varying said delay over a sequence of instructions;

providing a clock signal to said interface;

producing a data sync signal from said data signal and said clock signal;

producing a strobe sync signal from said strobe signal and said clock signal;

delaying said data signal and said data sync signal by the same amount;

delaying said strobe signal and said strobe sync signal by the same amount; and determining when errors occur and hence the maximum time margin available.

2. The method according to claim 1, wherein the data signal and data sync signal on the one hand and the strobe signal and strobe sync signal on the other hand are delayed in relation to each other so as to vary the setup and hold of the data with respect to the strobe.

3. A method of determining time margins between strobe and data signals in an interface, comprising:

connecting an interface between two chips, at least one having a core and an input/output device;

providing data and strobe signals from said core to said interface;

providing a delay in one of said data and strobe signals within said interface;

varying said delay over a sequence of instructions;

providing a clock signal to said interface;

producing a data sync signal from said data signal and said clock signal;

producing a strobe sync signal from said strobe signal and said clock signal;

determining when errors occur and hence the maximum time margin available; and, wherein said data sync signal is applied as a clock input to a first flipflop and said strobe sync signal is applied as a clock input to a second flipflop.

4. The method according to claim 3, wherein a data input of said first and second flipflops are connected to a transmit signal from the core.

5. An apparatus for determining a time margin in an interface, comprising:

two chips, at least one including a core and at least one input/output device;

an interface arranged between said two chips, said interface receiving data and strobe signals from said core, said interface including;

a data sync generator receiving said data signal and a clock signal to produce a data sync signal a strobe sync signal generator receiving said strobe signal and said clock signal to produce a strobe sync signal and a delay device provided within said interface for delaying one of said data and strobe signals, said delay device providing a variable delay so that the timing relationship between said data and said strobe signals can be varied until errors occur, thus providing the indication of the timing margin;

a first flipflop, said first flipflop receiving said data sync signal as a clock input and a second flipflop receiving said strobe sink signal as a clock input.

6. The apparatus according to claim 5, wherein said delay device includes four delay elements receiving said data signal, said data sync signal, said strobe signal and said strobe sync signal.

7. The apparatus according to claim 6, wherein said delay elements for receiving said data signal and data sync signal have the same delay and the delay elements receiving the strobe signal and strobe sync signal have the same delay.

* * * * *

UNITED STATES PATENT AND TRADEMARK OFFICE
CERTIFICATE OF CORRECTION

PATENT NO. : 6,952,790 B2
DATED : October 4, 2005
INVENTOR(S) : Ramanathan et al.

It is certified that error appears in the above-identified patent and that said Letters Patent is hereby corrected as shown below:

Title page,
Item [75], Inventors, delete "Ranco" and insert -- Rancho --.

Column 8,
Line 53, delete "sink" and insert -- sync --.

Signed and Sealed this

Seventh Day of February, 2006

JON W. DUDAS
*Director of the United States Patent and Trademark Office*

UNITED STATES PATENT AND TRADEMARK OFFICE
CERTIFICATE OF CORRECTION

PATENT NO. : 6,952,790 B2
DATED : October 4, 2005
INVENTOR(S) : Ramanathan et al.

It is certified that error appears in the above-identified patent and that said Letters Patent is hereby corrected as shown below:

<u>Title page,</u>
Item [75], Inventors, delete "Ranco" and insert -- Rancho --.

<u>Column 8,</u>
Line 53, delete "sink" and insert -- sync --.

Signed and Sealed this

Seventh Day of March, 2006

JON W. DUDAS
*Director of the United States Patent and Trademark Office*